United States Patent
Ojo (10) Patent No.: US 8,306,494 B2
(45) Date of Patent: Nov. 6, 2012

(54) METHOD AND SYSTEM FOR A SINGLE-ENDED INPUT LOW NOISE AMPLIFIER WITH DIFFERENTIAL OUTPUT

(75) Inventor: Adedayo Ojo, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 1117 days.

(21) Appl. No.: 12/191,637

(22) Filed: Aug. 14, 2008

(65) Prior Publication Data

US 2010/0041361 A1 Feb. 18, 2010

(51) Int. Cl.
*H04B 1/16* (2006.01)
*H03F 1/14* (2006.01)
*H03F 3/04* (2006.01)

(52) U.S. Cl. ............... 455/248.1; 455/293; 330/261; 330/301; 330/305

(58) Field of Classification Search ............ 455/232.1, 455/248.1, 286, 293, 307, 323, 333, 334, 455/341; 330/250, 252, 253, 254, 261, 296, 330/301, 305
See application file for complete search history.

(56) References Cited

U.S. PATENT DOCUMENTS

| | | | | |
|---|---|---|---|---|
| 5,945,878 | A * | 8/1999 | Westwick et al. | 330/301 |
| 7,587,224 | B2 * | 9/2009 | Zolfaghari | 455/556.1 |
| 7,596,364 | B2 * | 9/2009 | Sjoland | 455/341 |
| 7,688,146 | B2 * | 3/2010 | Kao et al. | 330/301 |
| 2003/0114129 | A1 * | 6/2003 | Jerng | 455/323 |
| 2005/0068099 | A1 * | 3/2005 | Floyd | 330/51 |
| 2006/0063493 | A1 * | 3/2006 | Yanduru et al. | 455/77 |
| 2008/0139149 | A1 * | 6/2008 | Mu et al. | 455/200.1 |
| 2008/0265992 | A1 * | 10/2008 | Bao et al. | 330/254 |
| 2010/0019848 | A1 * | 1/2010 | Rossi | 330/253 |

* cited by examiner

*Primary Examiner* — Blane J Jackson
(74) *Attorney, Agent, or Firm* — Thomas | Horstemeyer, LLP (57) ABSTRACT

Methods and systems for a single-ended input low noise amplifier (LNA) with differential output are disclosed and may include configuring the LNA and/or a balun on a chip for single-ended or differential mode, which may function as a load for the LNA. A frequency response and gain of the LNA may be configured via switched capacitors and resistors, which may include CMOS transistors. A transition frequency, and thus impedance matching and matching network gain, may be tuned via configurable gate-source capacitors. A received signal may be filtered via a surface acoustical wave (SAW) filter. The LNA may be impedance matched with an input device via the transition frequency tuning and off chip inductors and/or capacitors. The LNA may be configured for single-ended or differential input mode via switches outside of a signal path to the LNA and reverse isolation may be enabled via a cascode device.

17 Claims, 11 Drawing Sheets

METHOD AND SYSTEM FOR A SINGLE-ENDED INPUT LOW NOISE AMPLIFIER WITH DIFFERENTIAL OUTPUT

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing of audio signals. More specifically, certain embodiments of the invention relate to a method and system for a single-ended input low noise amplifier with differential output.

BACKGROUND OF THE INVENTION

As mobile, wireless, and/or handheld portable devices increasingly become multifunctional, "all-in-one," communication devices, these handheld portable devices integrate an increasingly wide range of functions for handling a plurality of wireless communication services. For example, a single handheld portable device may enable Bluetooth communications and wireless local area network (WLAN) communications.

Much of the front end processing for wireless communications services is performed in analog circuitry. Front end processing within a portable device may comprise a range of operations that involve the reception of radio frequency (RF) signals, typically received via an antenna that is communicatively coupled to the portable device. Receiver tasks performed on an RF signal may include demodulation, filtering, and analog to digital conversion (ADC), for example. Noise considerations may be important since the strength of the received RF signal may be low. The resulting front-end processed signal may be referred to as a baseband signal. The baseband signal typically contains digital data, which may be subsequently processed in digital circuitry within the portable device.

Front end processing within a portable device may also include transmission of RF signals. Transmitter tasks performed on a baseband signal may include digital to analog conversion (DAC), filtering, modulation, and power amplification (PA), for example. The power amplified, RF signal, is typically transmitted via an antenna that is communicatively coupled to the portable device by some means. The antenna utilized for receiving an RF signal at a portable device may or may not be the same antenna that is utilized for transmitting an RF signal from the portable device.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a single-ended input low noise amplifier with differential output, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a single-ended input low noise amplifier with differential output. Exemplary aspects of the invention may comprise configuring the LNA and/or a balun on a chip for single-ended or differential mode, and the balun may function as a load for the LNA. A frequency response and gain of the LNA may be configured via switched capacitors and resistors at an output of the LNA, which may include CMOS transistors. A transition frequency and thus impedance matching and matching network gain may be tuned via configurable gate-source capacitors for the CMOS transistors. A received signal may be filtered in the wireless receiver via a surface acoustical wave (SAW) filter. The LNA may be impedance matched with an input device via the transition frequency tuning and off chip inductors and/or capacitors. The LNA may be configured for single-ended or differential input mode via switches outside of a signal path to the LNA and reverse isolation may be enabled via a cascode device.

Figure 1:
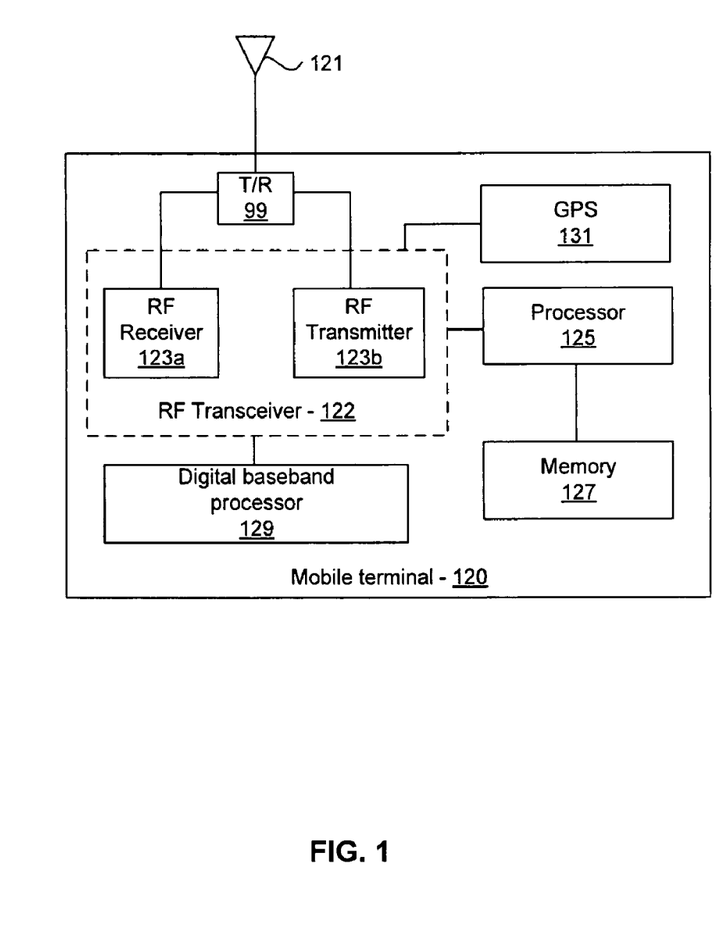
FIG. 1 is a block diagram of an exemplary mobile terminal, in accordance with an embodiment of the invention.

FIG. 1 is a block diagram of an exemplary mobile terminal, in accordance with an embodiment of the invention. Referring to FIG. 1, there is shown a wireless terminal 120 that may comprise an RF receiver 123a, an RF transmitter 123b, a digital baseband processor 129, a processor 125, and a memory 127. The wireless terminal 120 may enable communicating via a wireless local area network (WLAN) and a Bluetooth network, and may be enabled to receive and process GPS signals. In an embodiment of the invention, the RF receiver 123*a* and the RF transmitter 123*b* may be integrated into a single RF transceiver 122, for example. The RF receiver 123*a* and the RF transmitter 123*b* may be integrated into a single chip that comprises a WLAN radio and a Bluetooth radio, for example. The single chip comprising WLAN and Bluetooth radios may be implemented utilizing a single CMOS substrate, for example.

A single transmit and receive antenna 121 may be communicatively coupled to the RF receiver 123*a* and the RF transmitter 123*b*. In this regard, the single transmit and receive antenna 121 may enable WLAN and Bluetooth transmission and/or reception, for example. A switch or other device having switching capabilities may be coupled between the RF receiver 123*a* and RF transmitter 123*b*, and may be utilized to switch the antenna between transmit and receive functions. The wireless terminal 120 may be operated in a system, such as a Wireless Local Area Network (WLAN), a cellular network, a digital video broadcast network, and/or a Wireless Personal Area Network (WPAN) such as a Bluetooth network, for example. In this regard, the wireless terminal 120 may support a plurality of wireless communication protocols, including the IEEE 802.11g/n standard specifications for WLAN networks.

The RF receiver 123*a* may comprise suitable logic, circuitry, and/or code that may enable processing of received RF signals. The RF receiver 123*a* may enable receiving RF signals in a plurality of frequency bands in accordance with the wireless communications protocols that may be supported by the wireless terminal 120. Each frequency band supported by the RF receiver 123*a* may have a corresponding front-end circuit for handling low noise amplification and down conversion operations, for example. In this regard, the RF receiver 123*a* may be referred to as a multi-band receiver when it supports more than one frequency band. In another embodiment of the invention, the wireless terminal 120 may comprise more than one RF receiver 123*a*, wherein each of the RF receiver 123*a* may be a single-band or a multi-band receiver. The RF receiver 123*a* may be implemented on a chip. In an embodiment of the invention, the RF receiver 123*a* may be integrated with the RF transmitter 123*b* on a chip to comprise an RF transceiver, for example. In another embodiment of the invention, the RF receiver 123*a* may be integrated on a chip with more than one component in the wireless terminal 120.

The RF receiver 123*a* may quadrature down convert the received RF signal to a baseband frequency signal that comprises an in-phase (I) component and a quadrature (Q) component. The RF receiver 123*a* may perform direct down conversion of the received RF signal to a baseband frequency signal, for example. In some instances, the RF receiver 123*a* may enable analog-to-digital conversion of the baseband signal components before transferring the components to the digital baseband processor 129. In other instances, the RF receiver 123*a* may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123*a* and/or signals to be transferred to the RF transmitter 123*b*, when the RF transmitter 123*b* is present, for transmission to the network. The digital baseband processor 129 may also provide control and/or feedback information to the RF receiver 123*a* and to the RF transmitter 123*b* based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123*b* for transmission to the network. In an embodiment of the invention, the digital baseband processor 129 may be integrated on a chip with more than one component in the wireless terminal 120.

The RF transmitter 123*b* may comprise suitable logic, circuitry, and/or code that may enable processing of RF signals for transmission. The RF transmitter 123*b* may enable transmission of RF signals in a plurality of frequency bands. Each frequency band supported by the RF transmitter 123*b* may have a corresponding front-end circuit for handling amplification and up conversion operations, for example. In this regard, the RF transmitter 123*b* may be referred to as a multi-band transmitter when it supports more than one frequency band. In another embodiment of the invention, the wireless terminal 120 may comprise more than one RF transmitter 123*b*, wherein each of the RF transmitter 123*b* may be a single-band or a multi-band transmitter. The RF transmitter 123*b* may be implemented on a chip. In an embodiment of the invention, the RF transmitter 123*b* may be integrated with the RF receiver 123*a* on a chip to comprise an RF transceiver, for example. In another embodiment of the invention, the RF transmitter 123*b* may be integrated on a chip with more than one component in the wireless terminal 120.

The RF transmitter 123*b* may quadrature up convert the baseband frequency signal comprising I/Q components to an RF signal. The RF transmitter 123*b* may perform direct up conversion of the baseband frequency signal to a baseband frequency signal, for example. In some instances, the RF transmitter 123*b* may enable digital-to-analog conversion of the baseband signal components received from the digital baseband processor 129 before up conversion. In other instances, the RF transmitter 123*b* may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123*a*, the RF transmitter 123*b*, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications and/or Bluetooth communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123a for receiving WLAN and/or Bluetooth signals in the appropriate frequency band.

The RF receiver 123a may comprise a low noise amplifier (LNA) that may be configurable for single-ended or differential input mode. Similarly an on-chip balun may also be configurable for single-ended or differential input mode at the primary turns and differential output at the secondary turns. In this manner, the balun may be integrated on-chip as a load to the LNA, thereby improving the noise figure for the overall RF receiver 123a, while reducing the bill of material (BOM) of the system.

Figure 2A:
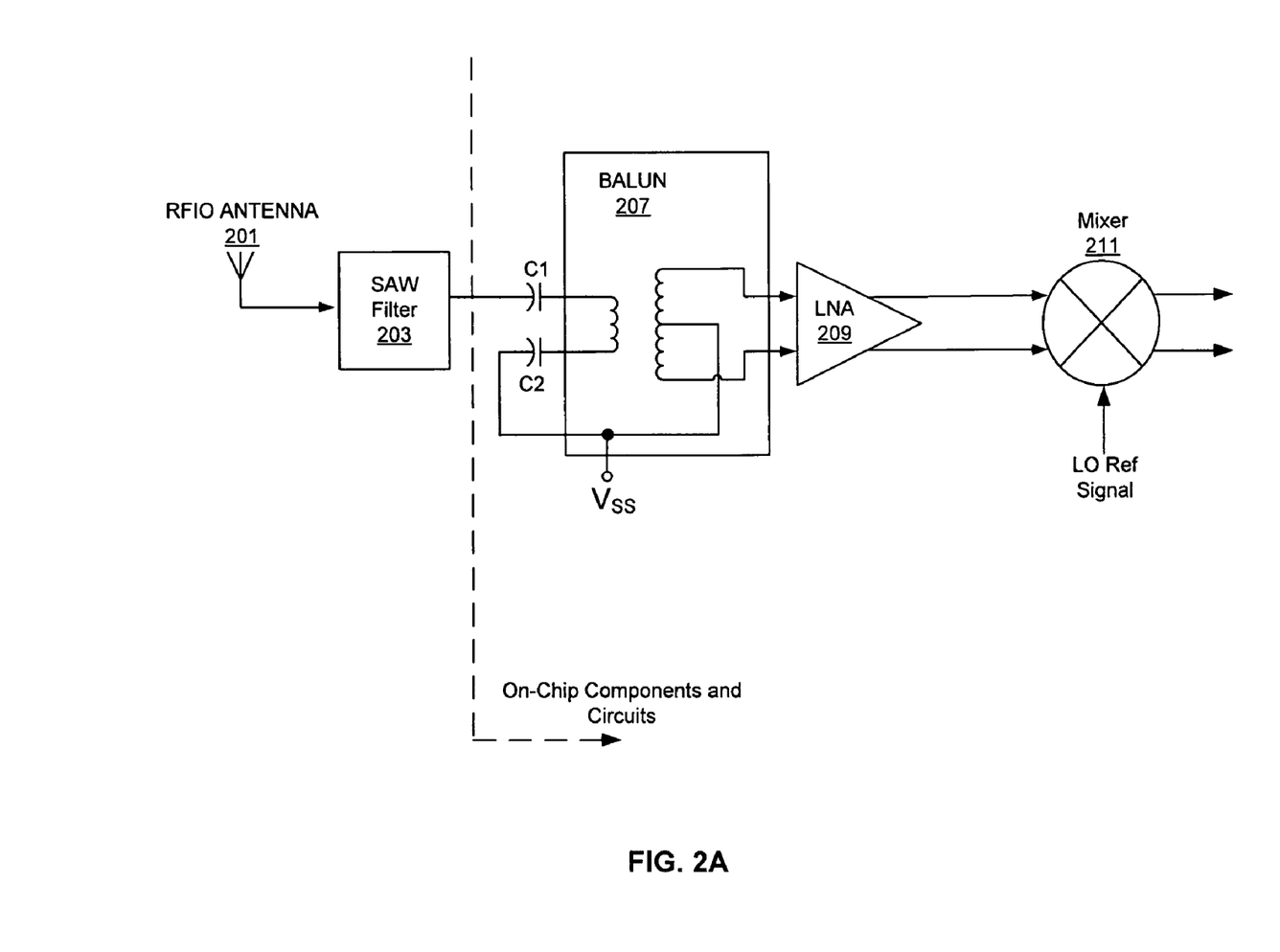
FIG. 2A is a block diagram illustrating an exemplary front-end receiver architecture, in accordance with an embodiment of the invention.

FIG. 2A is a block diagram illustrating an exemplary front-end receiver architecture, in accordance with an embodiment of the invention. Referring to FIG. 2A, there is shown an antenna 201, a surface acoustical wave (SAW) filter 203, AC coupling capacitors C1 and C2, a balun 207, a low-noise amplifier (LNA) 209, and a mixer 211. There is also shown a DC bias voltage $V_{SS}$. The components to the right of the dashed line in FIG. 2A may be integrated on a chip to reduce cost and space requirements of a wireless system.

The antenna 201 may be substantially similar to the antenna 121 described with respect to FIG. 1, and may enable the reception of RF signals. The SAW filter 203 may comprise suitable circuitry, logic, and/or code that may enable filtering out unwanted signals while passing a desired signal to its output. The capacitors C1 and C2 may enable AC coupling of the signal received by the antenna 201 and filtered by the SAW filter 203.

The balun 207 may comprise suitable circuitry, logic, and/or code that may enable converting a single-ended input signal to a differential output signal. The balun 207 may comprise a center-tapped transformer, for example. The LNA 209 may comprise suitable circuitry, logic, and/or code that may enable amplifying a received signal. The LNA 209 may comprise a differential LNA and may generate an amplified differential signal that may be communicated to the mixer 211. In an embodiment of the invention, the LNA 209 may comprise a two-stage LNA.

The mixer 211 may comprise suitable circuitry, logic, and/or code that may enable frequency down-conversion of a received signal. A reference signal, such as from a local oscillator, for example, may be utilized to down-convert the frequency of the received signal to an intermediate or baseband frequency that may be output in differential mode to be processed by subsequent circuitry.

In operation, an RF signal may be received by the antenna 201 and filtered by the SAW filter 203. The filtered signal may then be AC coupled to the balun 201 which may generate a differential signal from the received single-ended signal. The differential signal may then be communicated to the LNA 209 for amplification before being down-converted to an intermediate or baseband frequency by the mixer 211.

Figure 2B:
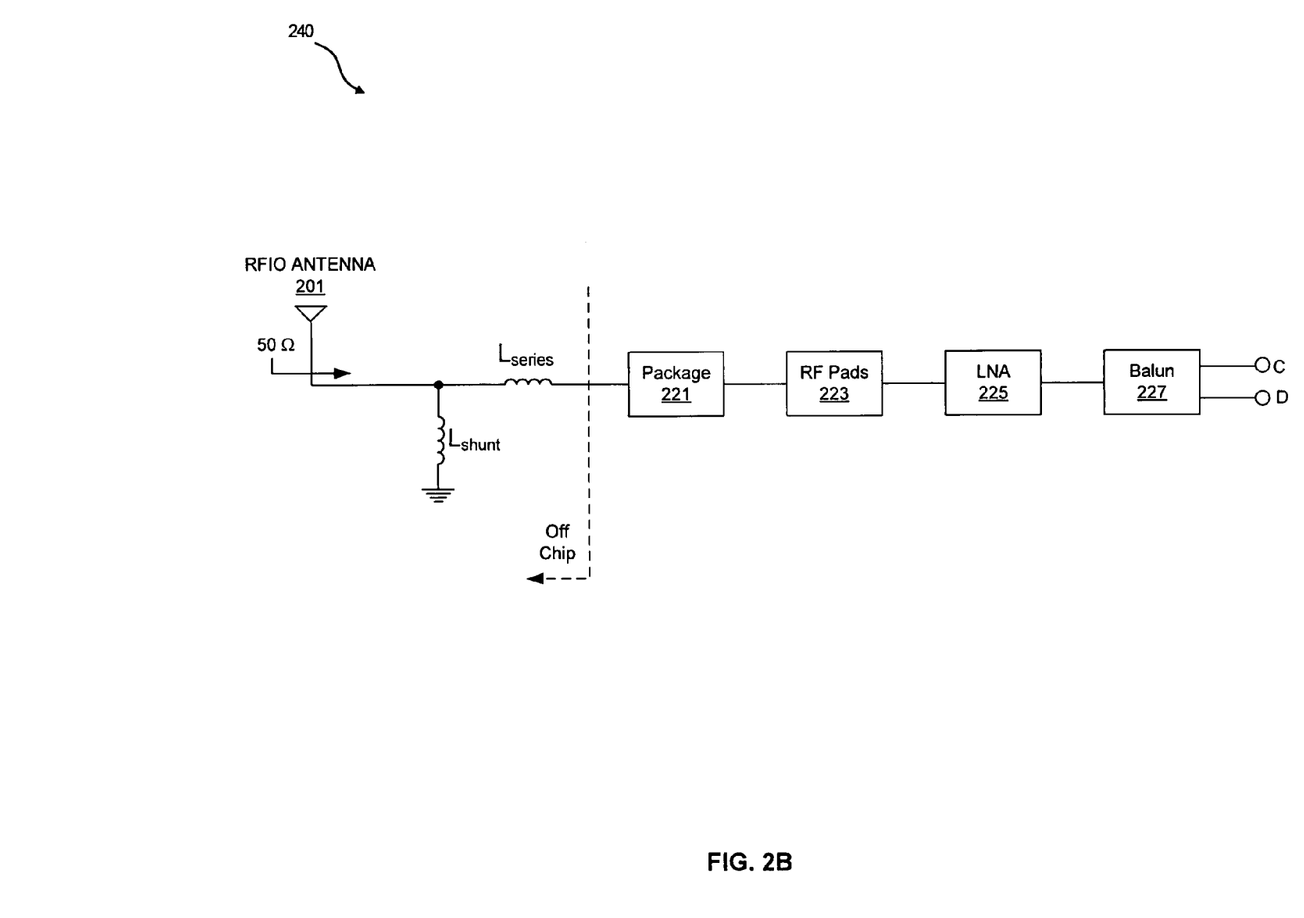
FIG. 2B is a block diagram illustrating an exemplary front-end receiver architecture, in accordance with an embodiment of the invention.

FIG. 2B is a block diagram illustrating an exemplary front-end receiver architecture, in accordance with an embodiment of the invention. Referring to FIG. 2B, there is shown the RF antenna 201, inductors $L_{series}$ and $L_{shunt}$, a package 221, RF pads 223, an LNA 225, and a balun 227. There is also shown output terminals C and D. In an embodiment of the invention, the components other than the antenna 201 and the inductors $L_{series}$ and $L_{shunt}$ may be integrated on a chip.

The antenna 201 may be as described with respect to FIG. 2A, and the LNA 225 and the balun 227 may be substantially similar to the LNA 209 and the balun 207 described with respect to FIG. 2A. In an embodiment of the invention, the antenna may comprise a 50 ohm characteristic impedance, for example.

The inductors $L_{series}$ and $L_{shunt}$ may enable impedance matching the RF antenna 201 and the LNA 225. The impedance matching may be affected by the package 221, which may comprise stray impedances due to the packaging of the chip, as well as the RF pads 223. In an embodiment of the invention, $L_{shunt}$ may be replaced by a shunt capacitor. In another embodiment of the invention, the inductors $L_{shunt}$ and $L_{series}$ may be integrated on-chip.

The RF pads 223 may comprise contact pads on the chip that may enable wire bonding or other methods of electrical contact to the chip.

In operation, the antenna 201 may receive an RF signal that may be communicated to the LNA 225 via the off-chip inductors $L_{series}$ and $L_{shunt}$ and the package impedances 221. The signal may comprise a single-ended signal that may be amplified by the LNA 225 and then to the balun 227. The balun 227 may generate a differential output to the terminals C and D.

Figure 2C:
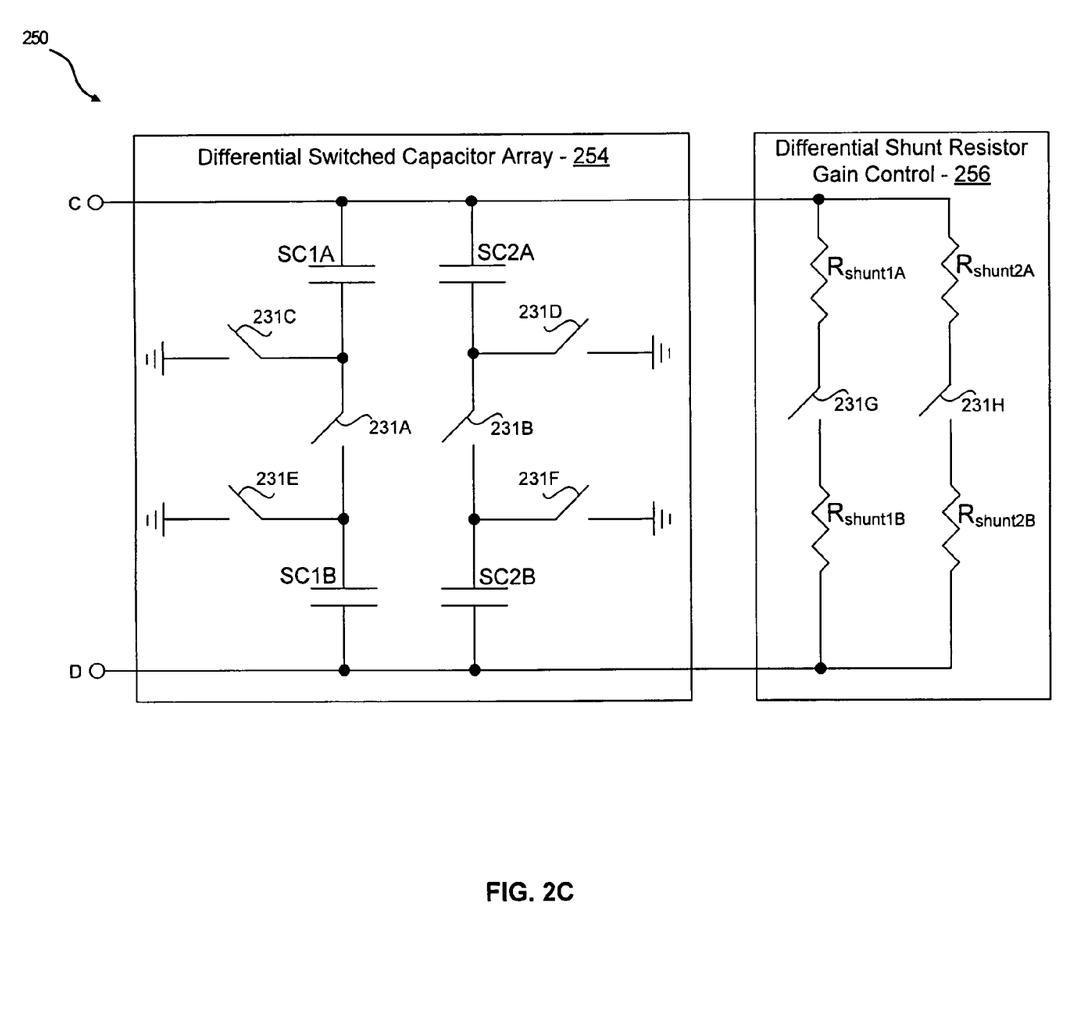
FIG. 2C is a circuit diagram illustrating an exemplary frequency tuning and gain control block, in accordance with an embodiment of the invention.

FIG. 2C is a circuit diagram illustrating an exemplary frequency tuning and gain control block, in accordance with an embodiment of the invention. Referring to FIG. 2C, there is shown a gain and frequency tuning block 250 comprising a differential switched capacitor array 254 and a differential shunt resistor gain control 256. The differential switched capacitor array 254 may comprise switches 231A-231F, and switched capacitors SC1A, SC1B, SC2A, and SC2B. The differential shunt resistor gain control 256 may comprise shunt resistors $R_{shunt1A}$, $R_{shunt1B}$, $R_{shunt2AB}$, and $R_{shunt2B}$. The differential switched capacitor array 254 may enable tuning of the frequency in the receiver front end 240, described with respect to FIG. 2B. In an embodiment of the invention, the switches 231A, 231C, and 231E may be controlled by the same signal, such that all three switches may be on or off. This configuration may also be applied for the switches 231B, 231D, and 231F.

The switches 231A-231H may comprise CMOS transistors, for example, and may enable switching on and off the capacitors SC1A, SC1B, SC2A, and SC2B and the resistors $R_{shunt1A}$, $R_{shunt1B}$, $R_{shunt2AB}$, and $R_{shunt2B}$, such that the frequency response and gain may be tuned. The capacitors SC1A, SC1B, SC2A, and SC2B may comprise differential phase correction switched capacitors and may also be used to adjust the differential output phase of the LNA 225. By generating a capacitive offset at the C and D outputs, the phase relationship may be made programmable. In this manner, a high coupling efficiency (HCE) differential inductor may be used as an alternative to the balun 227, as described with respect to FIG. 3B, since a differential inductor may occupy less space and exhibit lower loss, for example.

In operation, a signal may be communicated to the gain and frequency tuning block 250 at the terminals C and D. The capacitors SC1A, SC1B, SC2A, and SC2B may be switched into and/or out of the circuit via the switches 231A-231F to tune the LNA output frequency response and/or the differential output phase and the resistors $R_{shunt1A}$, $R_{shunt1B}$, $R_{shunt2AB}$, and $R_{shunt2B}$ may be switched into and/or out of the circuit via the switches 231G and 231H to tune the gain of the LNA.

Figure 2D:
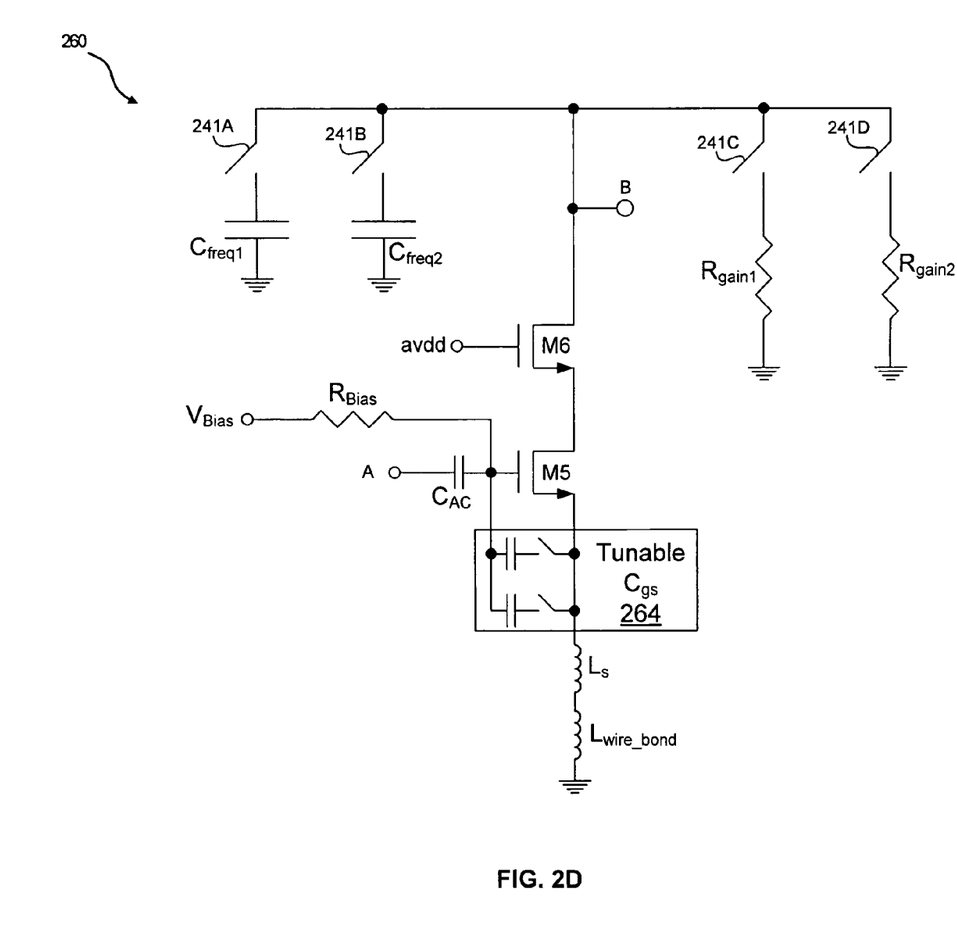
FIG. 2D is a circuit diagram illustrating an exemplary single-ended input and single-ended output low noise amplifier, in accordance with an embodiment of the invention.

FIG. 2D is a circuit diagram illustrating an exemplary single-ended input and single-ended output low noise amplifier, in accordance with an embodiment of the invention. Referring to FIG. 2D, there is shown single-ended (SE) input/SE output LNA 260 comprising NMOS transistors M5 and M6, capacitors $C_{freq1}$, $C_{freq2}$, $C_{AC}$, tunable capacitance $C_{GSt}$, switches 241A-241D, resistors $R_{gain}$, $R_{gain2}$, and $R_{Bias}$, and inductors $L_s$ and $L_{wire\_bond}$. There is also shown a single-ended input terminal A, and a single-ended output terminal B, and a power supply voltage avdd. By utilizing the cascode configuration of M5 and M6, reverse isolation may be improved.

The tunable capacitance $C_{GSt}$ may comprise an array of capacitors and switches coupled to the gate and source terminals of the CMOS transistor M5 that may enable a programmable transition frequency, $f_T$, which enables tunable matching network gain and tunable input match. Tunable matching network gain provides a degree of freedom for optimizing overall antenna referred input noise, such as the overall noise referred to antenna 201, described with respect to FIG. 2B. The transition frequency of the LNA 260 may be determined based on the following relationship:

$$f_t = \frac{\omega_T}{2\pi} \cong \frac{g_m}{2\pi(C_{GS} + C_{GD})}$$

where $C_{GD}$ is the negligible gate-drain capacitance of the CMOS transistor M5 and $C_{GS}$ is the parallel combination of the gate-source capacitance of M5 and the tunable capacitance $C_{GSt}$.

Additionally, the tunable capacitance $C_{GSt}$ may compensate for the stray inductance indicated by the inductor $L_{wire\_bond}$, and may increase the robustness of the LNA 260 input match and susceptibility to package impedances.

The resistors $R_{gain1}$ and $R_{gain2}$ may be switched in and out of the circuit to control the gain of the LNA 260, and may be switched into and out of the circuit via the switches 241C and 241D. The number of resistors is not limited to the number shown in FIG. 2D. Accordingly, any number of resistors may be incorporated, depending on the desired gain control and area constraints, for example.

The capacitors $C_{freq1}$, $C_{freq2}$ may enable control of the frequency response of the LNA 260, and may be switched into and out of the circuit via the switches 241A and 241B. The number of capacitors is not limited to the number shown in FIG. 2D. Accordingly, any number of capacitors may be incorporated, depending on the desired frequency control and area constraints, for example.

The inductor $L_s$ may comprise an on-chip series inductance coupled to the source terminal of the NMOS transistor M5 for impedance matching. The inductor $L_{wire\_bond}$ may comprise the stray inductance from wire bonding to the ground supply of the chip comprising the LNA 260.

In operation, an RF signal may be received at the single-ended input A, and may be AC coupled to the NMOS transistor M5 via the capacitor $C_{AC}$. The capacitors $C_{freq1}$, $C_{freq2}$, and $C_{GSt}$ and the resistors $R_{gain1}$ and $R_{gain2}$ may be configured to optimize the output frequency response, input match, and total gain, comprising the matching network gain and actual LNA core gain combined, of the LNA 260. The output signal may be communicated to a subsequent stage via the single-ended output terminal B. The LNA 260 noise figure may be improved by proper impedance matching and gain configuration via the capacitors $C_{freq1}$, $C_{freq2}$, and $C_{GSt}$ and the resistors $R_{gain1}$ and $R_{gain2}$.

Figure 3A:
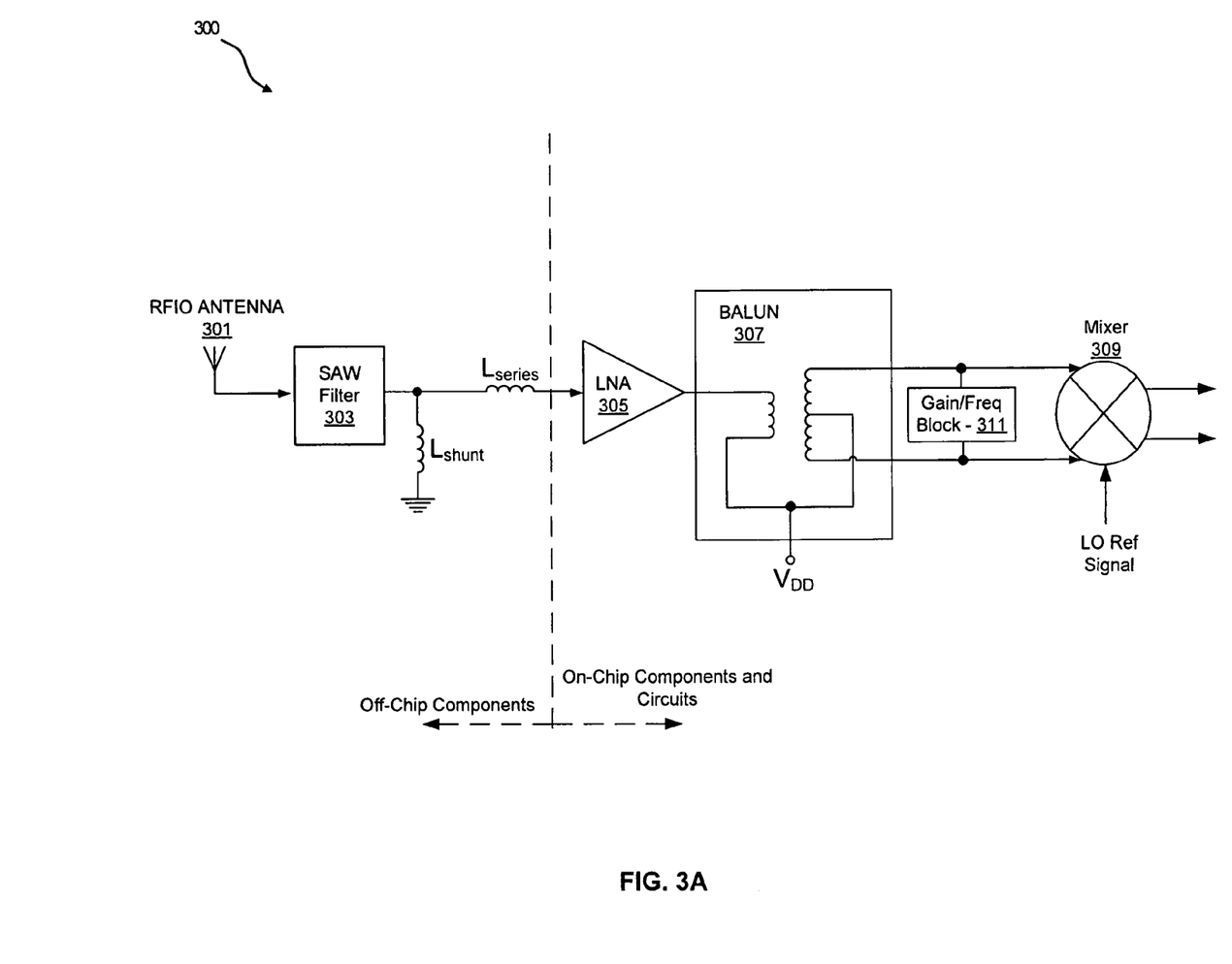
FIG. 3A is a diagram illustrating an exemplary receiver with a single-ended input, differential output balun, in accordance with an embodiment of the invention.

FIG. 3A is a diagram illustrating an exemplary receiver with a single-ended input, differential output balun, in accordance with an embodiment of the invention. Referring to FIG. 3A, there is shown a receiver 300 comprising an RF antenna 301, a surface acoustical wave (SAW) filter 303, an LNA 305, a balun 307, a mixer 309, and a gain/frequency block 311. The RF antenna 301, the SAW filter 303, and the mixer 309 may be substantially similar to the RF antenna 201, the SAW filter 203, and the mixer 211. The gain/frequency block 311 may be substantially similar to the gain and frequency tuning block 250. The components to the right of the dashed line in FIG. 3A may comprise devices integrated on-chip, and the RF antenna 301 and the SAW filter 303 may comprise off-chip passive devices.

The inductors $L_{series}$ and $L_{shunt}$ may enable impedance matching the RF antenna 301 and the LNA 305. In an embodiment of the invention, $L_{shunt}$ may be replaced by a shunt capacitor. In another embodiment of the invention, the inductors $L_{shunt}$ and $L_{series}$ may be integrated on-chip.

The LNA 305 may comprise a single-ended input, single-ended output LNA, such as the LNA 260, described with respect to FIG. 2D. Power efficiency may be improved by utilizing a single-ended input LNA as compared to a differential input LNA. The output of the LNA 305 may be communicatively coupled to the balun 307, which may comprise an on-chip balun for converting a single-ended input signal to a differential output signal. In an embodiment of the invention, the balun 307 may be integrated after the LNA 305, which may significantly reduce the noise contribution of the balun thus improving the noise figure of the receiver as compared to conventional receiver systems in which the balun is integrated prior to the LNA input as shown with respect to FIG. 2A.

In an exemplary embodiment of the invention, the balun 307 may comprise a 5-terminal transformer that may act as a load to the LNA 305. Two terminals of the balun 307 may be coupled to the bias voltage $V_{DD}$ with another terminal communicatively coupled to the output of the LNA 305, and two remaining terminals, comprising the secondary turns of the balun, communicatively coupled to the mixer 309.

The gain/frequency block 311 may comprise arrays of switched capacitors and resistors, substantially similar to the gain and frequency tuning block 250 described with respect to FIG. 2C, that may enable controlling the frequency response and the gain of the LNA 305 by configuring the loading of the gain stage.

In operation, an RF signal may be received by the RF antenna 301, which may be communicated to the LNA 305 via the SAW filter 303, which may filter out unwanted signals. The LNA 305 may amplify the received single-ended input signal, and may communicate the output signal to the balun 307. The gain and frequency response may be configured via the gain/frequency block 311. The balun 307 may convert the single-ended input signal into a differential signal that may be communicated to the mixer 309 for conversion to an intermediate and/or baseband frequency utilizing the LO reference signal and may be output in differential mode to be processed by subsequent circuitry.

Figure 3B:
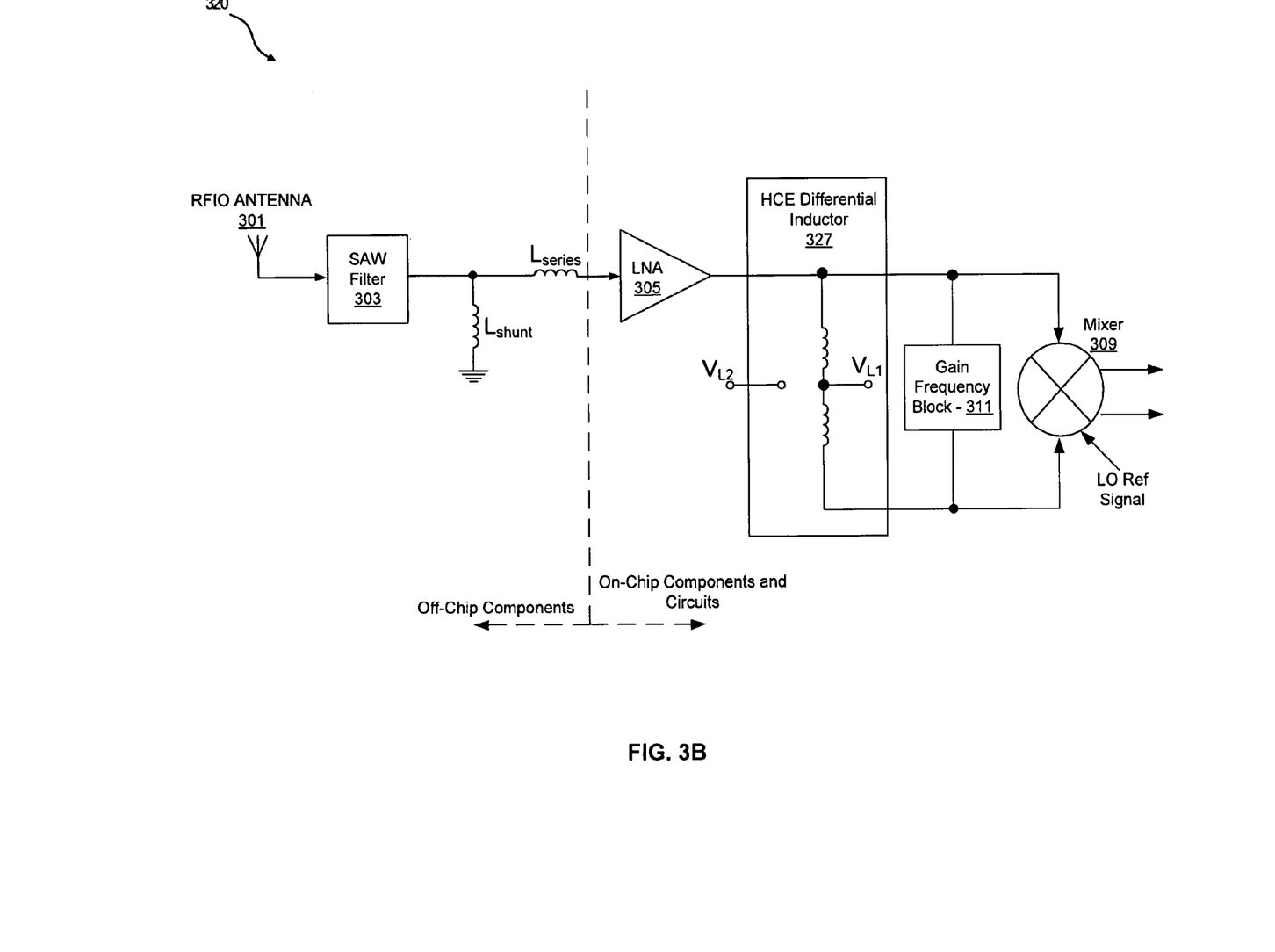
FIG. 3B is a diagram illustrating an exemplary receiver with a single-ended input, differential output via a differential inductor, in accordance with an embodiment of the invention.

FIG. 3B is a diagram illustrating an exemplary receiver with a single-ended input, differential output via a differential inductor, in accordance with an embodiment of the invention. Referring to FIG. 3B, there is shown a receiver 320 comprising the RF antenna 301, the surface acoustical wave (SAW) filter 303, the LNA 305, a high coupling efficiency (HCE) differential inductor 327, the gain/frequency block 311, and the mixer 309. The RF antenna 301, the SAW filter 303, the LNA 305, the gain/frequency block 311, and the mixer 309 may be as described with respect to FIG. 3A. The components to the right of the dashed line in FIG. 3B may comprise devices integrated on-chip, and the RF antenna 301 and the SAW filter 303 may comprise off-chip devices.

The inductors $L_{series}$ and $L_{shunt}$ may enable impedance matching the RF antenna 301 and the LNA 305. In an embodiment of the invention, $L_{shunt}$ may be replaced by a shunt capacitor. In another embodiment of the invention, the inductors $L_{shunt}$ and $L_{series}$ may be integrated on-chip.

The HCE differential inductor 327 may comprise one or more coupled inductor windings that enable the generation of a differential signal from a single-ended input signal, similar to a balun. Bias voltages $V_{L1}$ and $V_{L2}$ may be applied to the HCE differential inductor 327 to enable generation of the differential output signal.

In operation, an RF signal may be received by the RF antenna 301, which may be communicated to the LNA 305 via the SAW filter 303, which may filter out unwanted signals. The LNA 305 may amplify the received single-ended input signal, and may communicate the output signal to the HCE differential inductor 327. The gain and frequency response may be configured via the gain/frequency block 311. The HCE differential inductor 327 may convert the single-ended input signal received from the LNA 305 into a differential signal that may be communicated to the mixer 309 for conversion to an intermediate and/or baseband frequency utilizing the LO reference signal.

Figure 4:
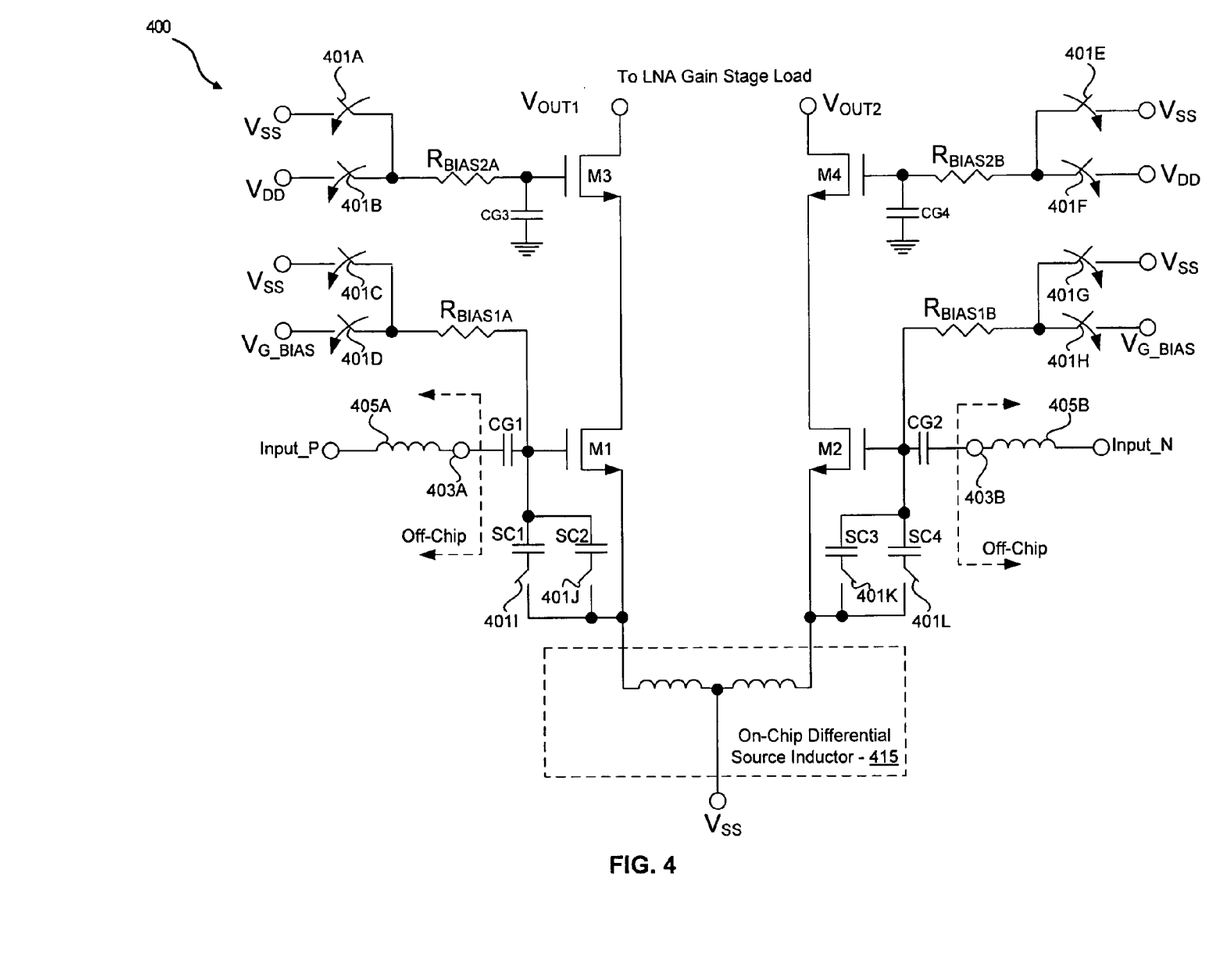
FIG. 4 is a diagram illustrating an exemplary configurable low noise amplifier, in accordance with an embodiment of the invention.

FIG. 4 is a diagram illustrating an exemplary configurable low noise amplifier, in accordance with an embodiment of the invention. Referring to FIG. 4, there is shown a configurable LNA 400 comprising NMOS input transistors M1 and M2, NMOS cascode transistors M3 and M4, switches 401A-401L, LNA input pads 403A and 403B, inductors 405A and 405B, resistors $R_{Bias1A}$, $R_{Bias1B}$, $R_{Bias2A}$, $R_{Bias2B}$, capacitors CG1, CG2, CG3, CG4, switched capacitors SC1-SC4, and on-chip differential source inductor 415. There is also shown bias voltages $V_{SS}$, $V_{DD}$, $V_{G\_Bias}$, input signals Input_P and Input_N, and output signals $V_{OUT\_1}$ and $V_{OUT\_2}$.

The switches 401A-401H enable the configuration of the LNA 400 into differential or single-ended input on either input transistor M1 or M2. For example, by closing switch 401C or 401G, NMOS input transistor M1 or M2 may be switched off, thereby configuring the LNA 400 into single-ended input mode. Similarly, the gates of the NMOS cascode transistors M3 or M4 may be biased in the on or off state, $V_{DD}$ or $V_{SS}$, respectively, to configure the LNA 400 into differential or single-ended input mode. By incorporating switches 401A-401H on both sides of the LNA 400, the LNA 400 may be configured in single-ended input mode on either input, depending on which side results in the best RF performance due to undesired on-chip crystal oscillator harmonic coupling, package level coupling, board level coupling and/or supply level coupling.

The capacitors CG1 and CG2 may enable DC coupling of the signal communicated to the NMOS input transistors M1 and M2, respectively. The resistors $R_{Bias1A}$, $R_{Bias1B}$, $R_{Bias2A}$, $R_{Bias2B}$ may enable biasing of the NMOS input and cascode transistors M1-M4 in the desired operational state, on or off, for example.

The switched capacitors SC1-SC4 may enable configuration of the frequency response and/or impedance matching of the LNA 400. Additionally, the on-chip differential source inductor 415 may also enable impedance matching for the LNA 400.

In operation, in an exemplary embodiment, the LNA 400 may be configured in single-ended input mode by closing the switches 401E and 401G, thus turning off the NMOS cascode and input transistors M4 and M2, respectively. Accordingly, switch 401B may be closed to turn on NMOS cascode transistor M3, and switch 401D may be closed to apply the bias voltage $V_{G\_BIAS}$ to the gate of the NMOS input transistor M1.

A single ended-input signal, Input_P, may be communicatively coupled to the gate of the NMOS input transistor M1 via the inductor 405A and the capacitor CG1. The inductor 405A may minimize and/or eliminate voltage spikes at the gate of the NMOS input transistor M1, and the capacitor CG1 may AC couple Input_P to the NMOS input transistor M1. The switches 401I and 401J may be configured to optimize the frequency response of the LNA 400 by switching the switched capacitors SC1 and SC2 into and/or out of the circuit, which may also provide impedance matching for an input device, such as an antenna, for example, to the LNA 400.

An amplified output signal may be communicated via the single-ended output node $V_{OUT\_1}$, since the $V_{OUT\_2}$ transistors M2 and M4 are switched off in this example. Alternatively, a single-ended output may be generated at $V_{OUT\_2}$ by reversing the biasing voltages to turn on the NMOS transistors M2 and M4, and turn off the NMOS transistors M1 and M3. In yet another embodiment of the invention, all four NMOS transistors M1-M4 may be turned on, thereby configuring the LNA 400 in differential mode, and a differential output signal may be generated at both output terminals $V_{OUT\_2}$ and $V_{OUT\_1}$.

Figure 5A:
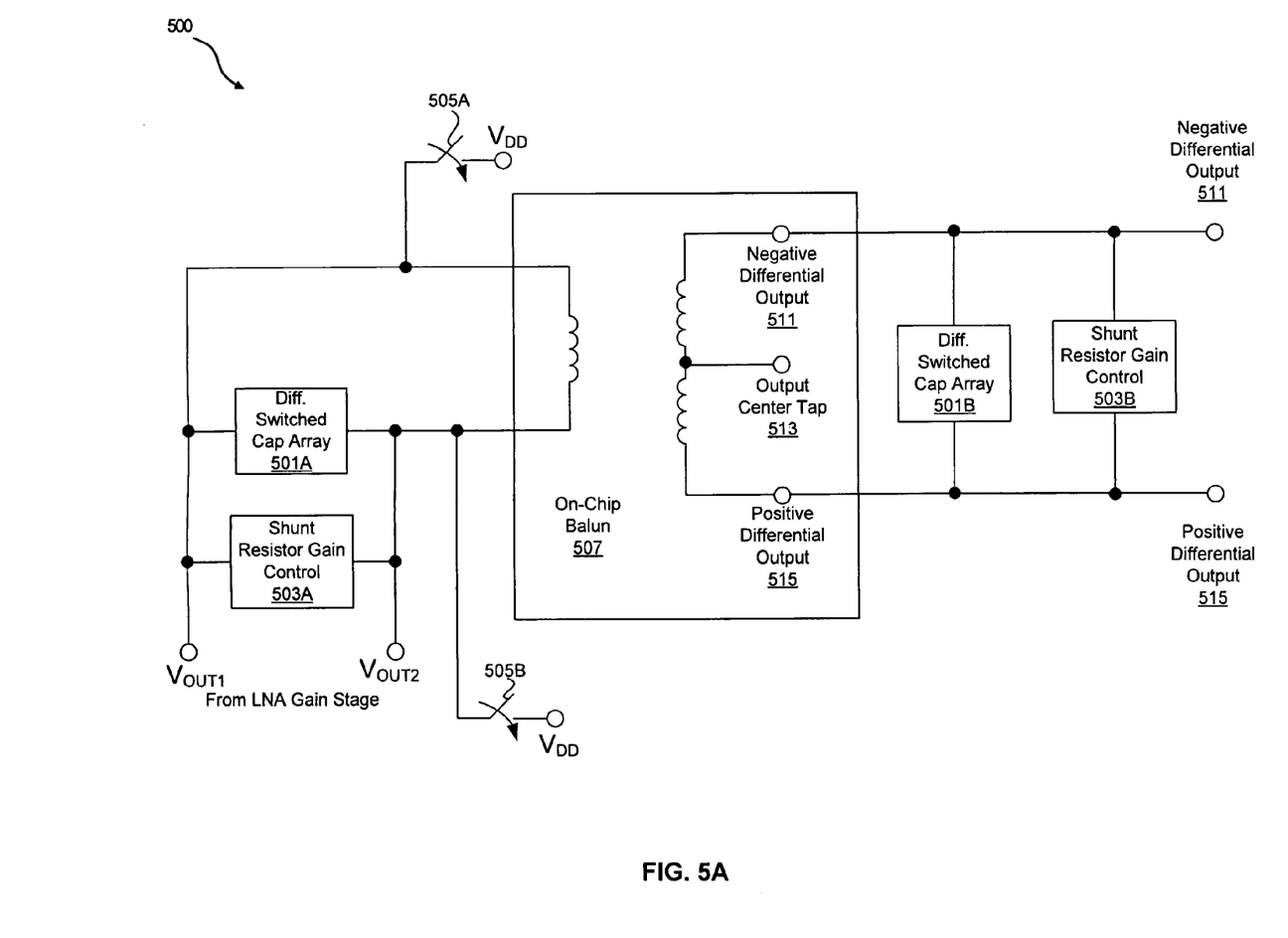
FIG. 5A is a block diagram illustrating an exemplary low noise amplifier balun load, in accordance with an embodiment of the invention.

FIG. 5A is a block diagram illustrating an exemplary low noise amplifier balun load, in accordance with an embodiment of the invention. Referring to FIG. 5A, there is shown an LNA load 500 comprising differential switched capacitor arrays 501A and 501B, shunt resistor gain control blocks 503A and 503B, switches 505A and 505B, and an on-chip balun 507. The balun 507 may comprise a negative differential output 511, an output center tap 513, and a positive differential output 515.

The differential switched capacitor arrays 501A and 501B may comprise arrays of capacitors that may be switched via CMOS transistors, for example, and may comprise any number of capacitors and switches desired, depending on tuning requirements and chip area limitations.

The shunt resistor gain control blocks 503A and 503B may comprise an array of resistors that may be switched by CMOS transistors, for example, and may comprise any number of resistors and switches desired, depending on gain requirements and chip area limitations.

The switches 505A and 505B may comprise CMOS transistors, for example, and may enable the configuration of the LNA load 500 as a differential ended-input or single-ended input. Accordingly, by closing the switch 505B, the $V_{OUT\_2}$ terminal may be electrically coupled to bias voltage $V_{DD}$, which may comprise AC ground. Alternatively, in instances where the switch 505A may be closed, the $V_{OUT\_1}$ terminal may be electrically coupled to bias voltage $V_{DD}$, which may comprise AC ground. In instances where neither switch 505A or 505B may be closed, the LNA load 500 may thus be configured in differential mode.

The balun 507 may act as a differential inductive load, effectively providing an output resistance and inductive component for the LNA 400, described with respect to FIG. 4.

In operation, the switches 505A and 505B may be opened or closed to configure the LNA load 500 in single-ended or differential mode. In instances where the LNA load 500 may be configured for single-ended mode, either switch 505A or 505B may be enabled, thus coupling that terminal to AC ground. An LNA output signal, such as from the LNA 400 described with respect to FIG. 4 may be communicated to the LNA load 500 via the terminals $V_{OUT1}$ and $V_{OUT2}$. An output signal may be communicated from the LNA load 500 via the negative differential output 511 and the positive differential output 515. The output center tap 513 may be biased at $V_{DD}$.

Figure 5B:
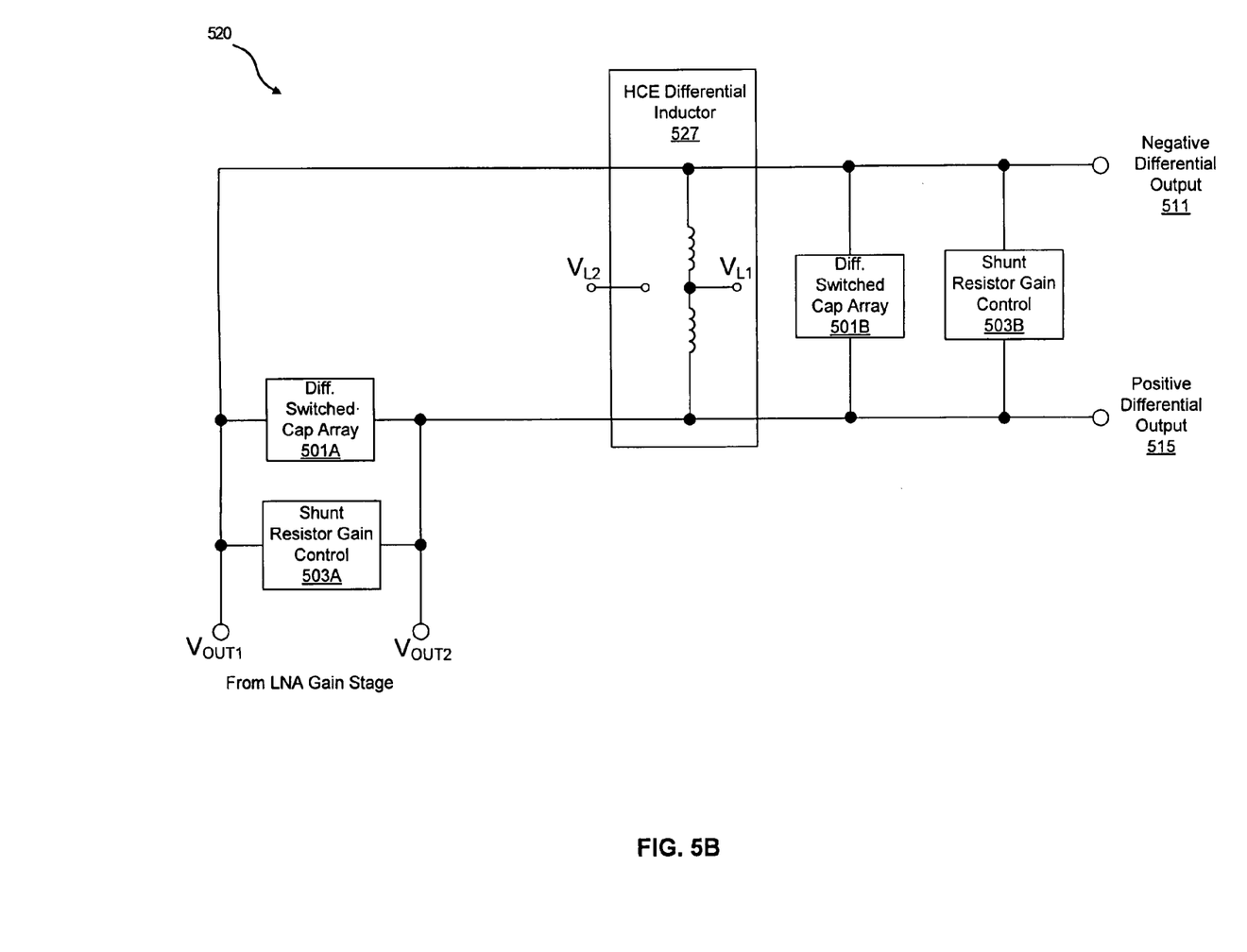
FIG. 5B is a block diagram illustrating an exemplary low noise amplifier differential inductor load, in accordance with an embodiment of the invention.

FIG. 5B is a block diagram illustrating an exemplary low noise amplifier differential inductor load, in accordance with an embodiment of the invention. Referring to FIG. 5B, there is shown LNA load 520 comprising the differential switched capacitor arrays 501A and 501B, the shunt resistor gain control blocks 503A and 503B, and an on-chip HCE differential inductor 527. The differential switched capacitor arrays 501A and 501B, and the shunt resistor gain control blocks 503A and 503B are as described with respect to FIG. 5A, and may be integrated before or after the differential inductor 527, or both as shown in FIG. 5B.

The HCE differential inductor 527 may comprise a plurality of inductors that may be coupled so as to enable the generation of a differential signal from a single-ended input signal, and may comprise bias terminals for proper operation. The HCE differential inductor 527 may utilize less space on-chip than an integrated balun.

In operation, an LNA output signal, such as from the LNA 400 described with respect to FIG. 4 may be communicated to the LNA load 520 via the terminals $V_{OUT1}$ and $V_{OUT2}$. An output signal may be communicated from the LNA load 520 via the negative differential output 511 and the positive differential output 515.

Figure 6:
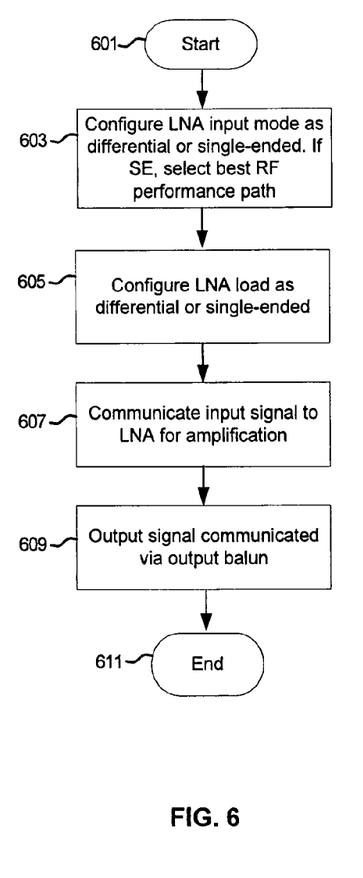
FIG. 6 is a block diagram of exemplary steps in the configuration of a single-ended/differential low noise amplifier, in accordance with an embodiment of the invention.

FIG. 6 is a block diagram of exemplary steps in the configuration of a single-ended/differential low noise amplifier, in accordance with an embodiment of the invention. In step 603, after start step 601, the LNA 400 may be configured for differential or single-ended input mode. In instances where the LNA input mode is single-ended, the path that gives the best RF performance may be selected. In step 605, the LNA load 500 may be configured for differential or single-ended mode. In step 607, a signal may be communicated to the LNA 400 for amplification, followed by step 609 where the signal may be output by the balun 507, followed by end step 611.

In an embodiment of the invention, a method and system is described for configuring a low noise amplifier (LNA) 305/400 on a chip for single-ended or differential mode. An on-chip balun 307/507 may be configured in single-ended or differential mode, where the balun 307/507 may function as a load for the LNA 305/400. A frequency response of the LNA 305/400 may be configured via switched capacitors $C_{freq1}/C_{freq2}$ at an output of the LNA 305/400 and a gain of the LNA 305/400 may be configured via switched resistors $R_{shunt1}/R_{shunt2}$ at an output of the LNA 305/400. The LNA 305/400 may comprise CMOS transistors M1-M6. A transition frequency and thus impedance matching of the LNA 305/400 and matching network gain may be tuned via configurable gate-source capacitors SC1-SC4/$C_{GS}$ for the CMOS transistors M1/M2/M5. The LNA 305/400 may be impedance matched with an input device 301 via the off chip inductors $L_{series}$ and $L_{Shunt}$ and/or capacitors.

A received signal may be filtered in the wireless receiver via a surface acoustical wave (SAW) filter 303. The LNA 305/400 may be impedance matched with an input device 301 via an on-chip inductor $L_s$. The LNA may be configured for single-ended or differential input mode via switches 401A-401H outside of a signal path to the LNA 305/400. Reverse isolation may be enabled via a cascode device M1/M3 and M2/M4 in the LNA 305/400.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a single-ended input low noise amplifier with differential output.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. One embodiment utilizes a commercially available processor, which may be implemented external to an ASIC implementation of the present system. Alternatively, in an embodiment where the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising: in a wireless receiver:
   configuring a low noise amplifier (LNA) on a chip for single-ended input mode or differential input mode via switches outside of a signal path to said LNA, wherein said LNA comprises CMOS transistors;
   configuring a balun within said chip in said single-ended input mode or said differential input mode, wherein said balun functions as a load for said LNA; and
   tuning a transition frequency of said LNA via configurable gate-source capacitors coupled to said CMOS transistors.

2. The method according to claim 1, comprising configuring a frequency response of said LNA via switched capacitors at an output of said LNA.

3. The method according to claim 1, comprising configuring a gain of said LNA via switched resistors at an output of said LNA.

4. The method according to claim 1, comprising configuring a matching network gain via said transition frequency tuning.

5. The method according to claim 1, comprising impedance matching said LNA with an input device via said transition frequency tuning.

6. The method according to claim 1, comprising impedance matching said LNA with an input device via off-chip inductors and/or capacitors and one or more on-chip inductors.

7. The method according to claim 1, comprising filtering a received signal in said wireless receiver via a surface acoustical wave (SAW) filter.

8. The method according to claim 1, comprising enabling reverse isolation via a cascode device in said LNA.

9. A system for processing signals, the system comprising:
one or more circuits in a wireless receiver, said one or more circuits comprising a low noise amplifier (LNA) and a balun, wherein said one or more circuits comprise CMOS transistors within said LNA, wherein said one or more circuits comprise configurable gate-source capacitors, and wherein said one or more circuits are enabled to:
configure said LNA for single-ended input mode or differential input mode;
configure said balun to operate in said single-ended input mode or said differential input mode, wherein said balun functions as a load for said LNA; and
tune a transition frequency of said LNA via said configurable gate-source capacitors coupled to said CMOS transistors,
wherein said one or more circuits comprise switches outside of a signal path to said LNA, and said one or more circuits are operable to configure said LNA for said single-ended input mode or said differential input mode via said switches outside of said signal path to said LNA.

10. The system according to claim 9, wherein said one or more circuits comprise switched capacitors, and said one or more circuits are operable to configure a frequency response of said LNA via said switched capacitors that are at an output of said LNA.

11. The system according to claim 9, wherein said one or more circuits comprise switched resistors, and said one or more circuits are operable to configure a gain of said LNA via said switched resistors that are at an output of said LNA.

12. The system according to claim 9, wherein said one or more circuits are operable to configure a matching network gain via said transition frequency tuning.

13. The system according to claim 9, wherein said one or more circuits are operable to impedance match said LNA with an input device via said transition frequency tuning.

14. The system according to claim 9, wherein said one or more circuits are operable to impedance match said LNA with an input device via off-chip inductors and/or capacitors and one or more on-chip inductors.

15. The system according to claim 9, wherein said one or more circuits comprise a surface acoustical wave (SAW) filter, and said one or more circuits are operable to filter a received signal in said wireless receiver via said surface acoustical wave (SAW) filter.

16. The system according to claim 9, wherein said one or more circuits comprise a cascode device, and said one or more circuits are operable to enable reverse isolation via said cascode device in said LNA.

17. A system, comprising:
a low noise amplifier (LNA) on a chip;
switches for configuring said low noise amplifier (LNA) for single-ended input mode or differential input mode, wherein said switches are outside of a signal path to said LNA;
a balun within the chip configured to provide a load for said LNA; and
gate-source capacitors configured to provide a tunable matching network gain and tunable impedance matching of said LNA via a programmable transition frequency of said LNA.

* * * * *